United States Patent
Yoshizawa

(10) Patent No.: US 7,489,174 B2
(45) Date of Patent: Feb. 10, 2009

(54) DYNAMIC FLIP-FLOP CIRCUIT

(75) Inventor: Atsushi Yoshizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 47 days.

(21) Appl. No.: 11/709,770

(22) Filed: Feb. 23, 2007

(65) Prior Publication Data

US 2007/0216460 A1    Sep. 20, 2007

(30) Foreign Application Priority Data

Mar. 2, 2006    (JP) ............................ 2006-056697

(51) Int. Cl.
    *H03K 3/00* (2006.01)
(52) U.S. Cl. ................. 327/218; 327/199; 327/200; 327/201; 327/202; 327/203; 327/204; 327/205; 327/206; 327/207; 327/208; 327/209; 327/210; 327/211; 327/212
(58) Field of Classification Search ............... 327/218
    See application file for complete search history.

(56) References Cited

U.S. PATENT DOCUMENTS

| | | | |
|---|---|---|---|
| 5,592,114 A * | 1/1997 | Wu et al. ..................... 327/208 |
| 6,100,730 A * | 8/2000 | Davis et al. ................. 327/117 |
| 6,275,083 B1 * | 8/2001 | Martinez et al. ............ 327/218 |
| 6,448,831 B1 * | 9/2002 | Hunt et al. .................. 327/211 |
| 6,680,638 B2 * | 1/2004 | Kim et al. ................... 327/218 |
| 6,737,900 B1 * | 5/2004 | Wu ............................. 327/218 |
| 2003/0210085 A1 * | 11/2003 | Larsson et al. .............. 327/211 |
| 2006/0082405 A1 * | 4/2006 | Chatterjee et al. .......... 327/218 |

OTHER PUBLICATIONS

Jiren Yuan et al., "High-Speed CMOS Circuit Technique", IEEE Journal of Solid-State Circuits, vol. 24, No. 1, Feb. 1989, pp. 62-70.

* cited by examiner

*Primary Examiner*—Tuan T Lam
*Assistant Examiner*—Daniel Rojas
(74) *Attorney, Agent, or Firm*—Finnegan, Henderson, Farabow, Garrett & Dunner, L.L.P.

(57) ABSTRACT

A dynamic flip-flop circuit which outputs an output signal on which a digital data signal is reflected based on a clock, includes: a first control stage configured to output a signal having a level inverted from that of the digital data signal within a period within which the clock has a second level; a second control stage configured to output a signal of a first level within the period within which the clock has the second level and a signal of a level within another period within which the clock has the first level; a third control stage configured to output an output signal of the first level within a period within which the signal outputted from the second control stage has the second level; and a phase adjustment circuit configured to adjust the phase to produce a second clock and supply the second clock to the third control stage.

6 Claims, 13 Drawing Sheets

Prior Art

DYNAMIC FLIP-FLOP CIRCUIT

CROSS REFERENCES TO RELATED APPLICATIONS

The present invention contains subject matter related to Japanese Patent Application JP 2006-056697 filed with the Japanese Patent Office on Mar. 2, 2006, the entire contents of which being incorporated herein by reference.

BACKGROUND OF THE INVENTION

1. Field of the Invention

This invention relates to a dynamic flip-flop circuit which operates with electric charge charged into and discharged from a parasitic capacitor in a circuit.

2. Description of the Related Art

A flip-flop (F/F) usually has two stable states of H and L and is used as a basic circuit for a main storage apparatus, a cache memory or a register of a computer. Flip-flops are classified into RS-type, JK-type, T-type and D-type flip-flops depending upon the configuration and function of the circuit. The flip-flops of the type described are selectively used in accordance with an purpose of use. For example, a D-type flip-flop (hereinafter referred to as flip-flop circuit) latches a digital data signal inputted thereto when the level of a clock inputted thereto from the outside changes from the H level to the L level or conversely from the L level to the H level. Thereafter, the flip-flop circuit keeps its output.

Such a flip-flop circuit as just mentioned is in the past formed from a static circuit such as a CMOS (Complementary MOS) flip-flop or a SCL (Source Coupled Logic) flip-flop. On the other hand, in recent years, a dynamic type flip-flop circuit which operates with charge which is charged into and discharged from a parasitic capacitor in a circuit has been proposed. One of such flip-flop circuits as just mentioned is disclosed, for example, in "High-speed CMOS Circuit Technique", IEEE JOURNAL OF SOLID-STATE CIRCUITS, Vol. 24, No. 1, February, 1989. When compared with the flip-flop circuit formed from such a static circuit as described above, the dynamic flip-flop circuit is advantageous in that it exhibits low power consumption and can operate at a high speed.

SUMMARY OF THE INVENTION

However, when the dynamic flip-flop circuit described above is used, desired action may not always be obtained. For example, where the dynamic flip-flop circuit is used to form a frequency divider, an output of a stable duty ratio of 50% may not be obtained. Further, where the dynamic flip-flop circuit is used to form a Johnson counter, a large glitch appears in the output of the Johnson counter.

Therefore, it is demanded to provide a novel and improved dynamic flip-flop circuit from which a good output waveform can be obtained even where the dynamic flip-flop circuit is used in a frequency divider or a Johnson counter.

According to an embodiment of the present invention, there is provided a dynamic flip-flop circuit which outputs an output signal on which a digital data signal is reflected based on a clock, including a first control stage configured to output, within a period within which the clock has a second level, a signal having a level inverted from that of the digital data signal, a second control stage configured to output, within the period within which the clock has the second level, a signal of a first level but output, within another period within which the clock has the first level, a signal of a level based on the signal outputted from the first control stage, a third control stage configured to output, within a period within which the signal outputted from the second control stage has the second level, an output signal of the first level which makes the output signal of the dynamic flip-flop circuit, and a phase adjustment circuit configured to adjust the phase of the clock to produce a second clock and supply the second clock to the third control stage.

In the dynamic flip-flop circuit, the third control stage operates with the second clock supplied thereto from the phase adjustment circuit and changes the level of the output signal when the level of the second clock changes from the second level to the first level or reversely from the first level to the second level. Accordingly, if the phase of the second clock is retarded, then the timing of the level change of the output signal can be retarded. Similarly, if the phase of the second clock is advanced, then the timing of the level change of the output signal can be advanced.

The phase adjustment circuit may include one inverter circuit or two or more inverter circuits connected in series. In the dynamic flip-flop circuit, the inverter circuit or each of the inverter circuits of the phase adjustment circuit delays an input thereto by a predetermined interval of time and outputs the delayed input. Accordingly, the phase adjustment circuit can provide delay of a desired period of time to the input by selecting the number of stages of inverter circuits to be connected in series.

The phase adjustment circuit may use an output of one of the two or more inverter circuits connected in series as the second clock. In the dynamic flip-flop circuit, since the outputs of the inverter circuits of the phase adjustment circuit have phases different from each other, the phase adjustment amount can be changed suitably by extracting one of the outputs of the two or more inverter circuits as the second clock.

Alternatively, the phase adjustment circuit may be formed from a resistance element and a parasitic capacitor of the circuit. In the dynamic flip-flop circuit, the resistance element and the parasitic capacitor of the circuit of the phase adjustment circuit cooperate with each other to function as a delay circuit according to RC integration. Therefore, the clock inputted to the phase adjustment circuit can be delayed in accordance with the resistance value of the clock and the parasitic capacitor of the circuit.

Each of the first, second and third control stages may include a field effect transistor. In the dynamic flip-flop circuit, the field effect transistor constructs part of a parasitic capacitor of the circuit. Further, little current flows from the gate to the source or the drain of the field effect transistor, and consequently, the power consumption of the dynamic flip-flop circuit is low.

According to another embodiment of the present invention, there is provided a dynamic flip-flop circuit which outputs an output signal on which a digital data signal is reflected based on a clock, including a first P-type transistor connected to receive, at the gate thereof, the digital signal and connected at the drain thereof to a first power supply, a second P-type transistor connected to receive, at the gate thereof, the clock and connected at the drain thereof to the source of the first P-type transistor, a first N-type transistor connected to receive, at the gate thereof, the digital data signal and connected at the source thereof to the source of the second P-type transistor and at the drain thereof to a second power supply, a third P-type transistor connected to receive, at the gate thereof, the clock and connected at the drain thereof to the first power supply, a second N-type transistor connected at the gate thereof to the source of the second P-type transistor and connected at the source thereof to the source of the third P-type transistor, a third N-type transistor connected to receive, at the gate thereof, the clock and connected at the source thereof to the drain of the second N-type transistor and at the drain thereof to the second power supply, a fourth P-type transistor connected at the gate thereof to the source of the third P-type transistor and at the drain thereof to the first power supply and connected at the source thereof so as to output the output signal, a fourth N-type transistor connected to receive, at the gate thereof, the clock and connected at the source thereof to the source of the fourth P-type transistor, a fifth N-type transistor connected at the gate thereof to the source of the third P-type transistor, at the source thereof to the drain of the fourth N-type transistor and at the drain thereof to the second power supply, and a phase adjustment circuit connected to receive the clock and configured to adjust the phase of the clock to produce a second clock to be supplied to the gate of the fourth N-type transistor.

In the dynamic flip-flop circuit, the third control stage operates with the second clock supplied thereto from the phase adjustment circuit and changes the level of the output signal when the level of the second clock changes from the second level to the first level or reversely from the first level to the second level. Accordingly, if the phase of the second clock is retarded, then the timing of the level change of the output signal can be retarded. Similarly, if the phase of the second clock is advanced, then the timing of the level change of the output signal can be advanced.

With the dynamic flip-flop circuits, a good output waveform can be obtained also where they are used in a frequency divider or a Johnson counter.

DETAILED DESCRIPTION OF THE PREFERRED EMBODIMENTS

Preferred embodiments of the present invention are described below with reference to the accompanying drawings.

The terms "second level" and "first level" used in the following description are not used assuming that the first level is higher than the second level, but conversely the second level may be higher than the first level. Further, particular voltage values of the second and first levels are defined arbitrarily with regard to individual circuits. Furthermore, the voltage values of the second and first levels may be defined differently for individual signals such as a clock and a digital data signal.

Figure 13:
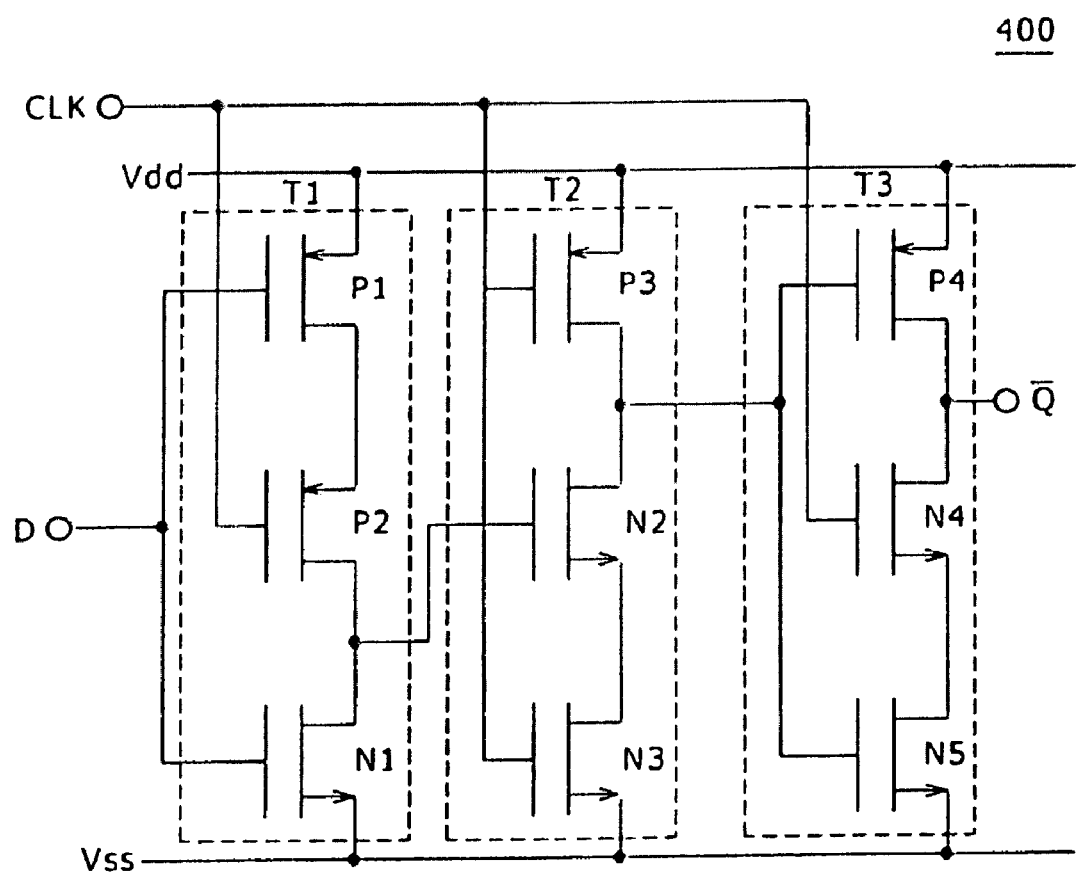
FIG. 13 is a circuit diagram showing a general circuit configuration of a dynamic flip-flop circuit.
Figure 14:
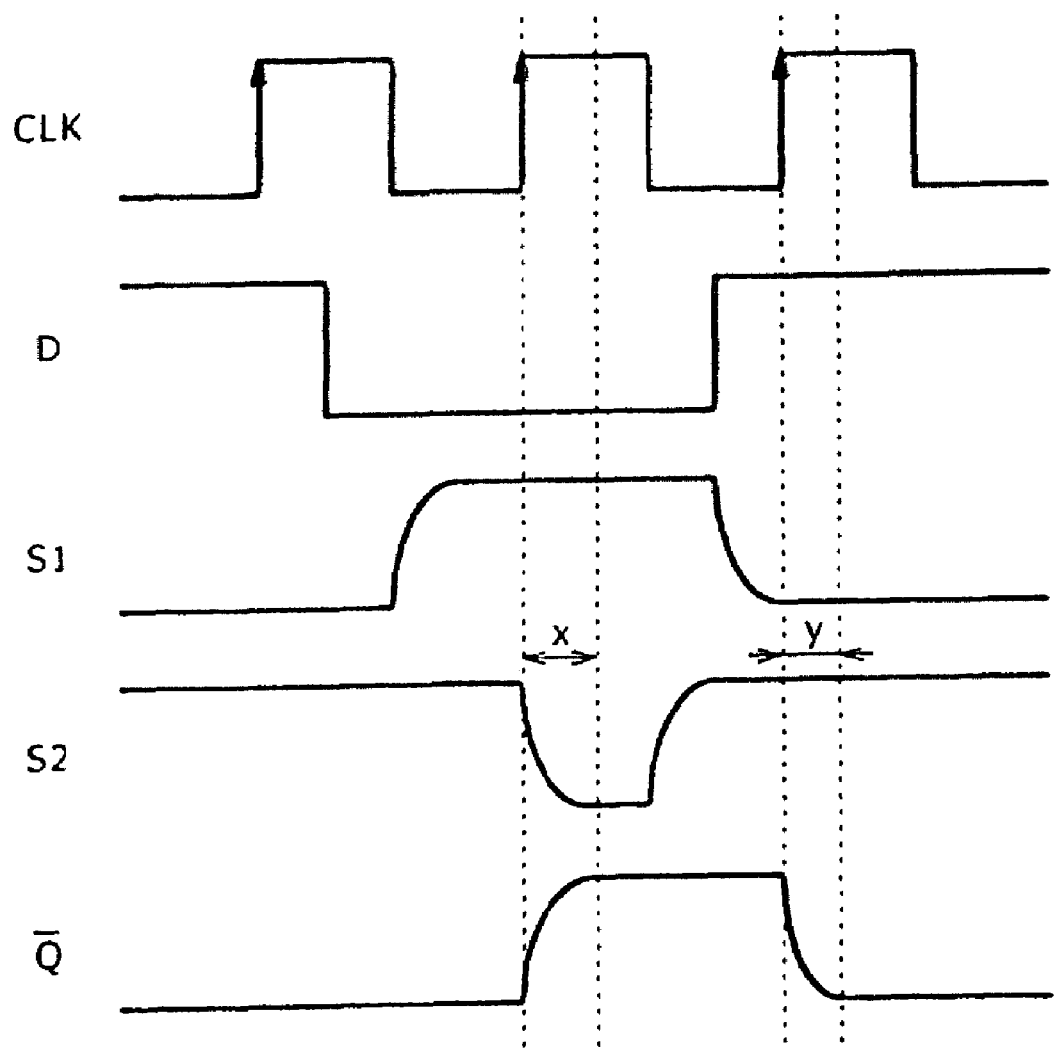
FIG. 14 is a timing chart illustrating waveforms of the dynamic flip-flop circuit of FIG. 13.

First, for reference, a typical example of a dynamic flip-flop circuit is described in regard to a configuration and action thereof with reference to FIGS. 13 and 14.

FIG. 13 shows a circuit configuration of the dynamic flip-flop circuit. Referring to FIG. 13, the dynamic flip-flop circuit 400 shown includes a first control stage T1, a second control stage T2 and a third control stage T3 and operates with a clock CLK, a digital data signal D, a first power supply Vdd and a second power supply Vss supplied thereto. It is to be noted that, in the accompanying drawings, a P-type transistor is denoted by P and an N-type transistor is denoted by N, and the subscripts are applied for identification of individual transistors.

The first control stage T1 includes a transistor P1, another transistor P2 and a further transistor N1. The transistor P1 is connected at the drain thereof to the first power supply Vdd of the first level, at the gate thereof to a data input terminal which is a supply source of the digital data signal D, and at the source thereof to the drain of the transistor P2. The transistor P2 is connected at the drain thereof to the source of the transistor P1, at the gate thereof to a clock input terminal of a supply source of the clock CLK, and at the source thereof to the second control stage T2. The transistor N1 is connected at the source thereof to the source of the transistor P2, at the gate thereof to the data input terminal, and at the drain thereof to the second power supply Vss of the second level.

The second control stage T2 includes a transistor P3, another transistor N2 and a further transistor N3. The transistor P3 is connected at the drain thereof to the first power supply Vdd, at the gate thereof to the clock input terminal, and at the source thereof to the third control stage T3. The transistor N2 is connected at the source thereof to the source of the transistor P3, at the gate thereof to the source of the transistor P2, and at the drain thereof to the source of the transistor N3. The transistor N3 is connected at the source thereof to the drain of the transistor N2, at the gate thereof to the clock input terminal, and at the drain thereof to the second power supply Vss.

The third control stage T3 includes a transistor P4, another transistor N4 and a further transistor N5. The transistor P4 is connected at the drain thereof to the first power supply Vdd, at the gate thereof to the source of the transistor P3, and at the source thereof to an output terminal. The transistor N4 is connected at the source thereof to the source of the transistor P4, at the gate thereof to the clock input terminal, and at the drain thereof to the source of the transistor N5. The transistor N5 is connected at the source thereof to the drain of the transistor N4, at the gate thereof to the source of the transistor P3, and at the drain thereof to the second power supply Vss.

Now, action of the dynamic flip-flop circuit 400 is described. Within a period within which the clock CLK inputted to the first control stage T1 has the second level, the transistor P2 conducts. Consequently, the first control stage T1 inverts the digital data signal D which has one of the two values of the first level and the second level, and outputs the inversion signal to the second control stage T2. Within another period within which the clock CLK inputted to the first control stage T1 has the first level, the transistor P2 does not conduct. Further, if the digital data signal D inputted to the first control stage T1 has the second level, then also the transistor N1 does not conduct. Therefore, the output of the first control stage T1 to the second control stage T2 is kept in a preceding state by a parasitic capacitor of the circuit. Within another period within which the digital data signal D inputted to the first control stage T1 has the high level, the transistor N1 conducts, and consequently, the transistor N1 outputs a signal of the second level to the second control stage T2.

Within a period within which the clock CLK inputted to the second control stage T2 has the second level, the transistor P3 conducts. Consequently, the second control stage T2 outputs a signal of the first level to the third control stage T3. Within another period within which the clock CLK inputted to the second control stage T2 has the first level, the transistor P3 does not conduct while the transistor N3 conducts. Further, if the input from the first control stage T1 has the high level, then the transistor N2 conducts, and consequently, the second control stage T2 outputs a signal of the second level to the third control stage T3. If the input from the first control stage T1 has the second level, then since both of the transistor N2 and the transistor P3 exhibit a non-conducting state, the output of the second control stage T2 to the third control stage T3 is kept in a preceding state by the parasitic capacitor of the circuit.

Within a period within which the clock CLK inputted from the second control stage T2 to the third control stage T3 has the second level, the transistor P4 conducts. Consequently, the third control stage T3 outputs a signal of the first level to the output terminal. Within another period within which the signal inputted from the second control stage T2 has the first level, the transistor P4 does not conduct while the transistor N5 conducts. Further, if the clock CLK inputted to the third control stage T3 has the first level, then since the transistor N4 conducts, the third control stage T3 outputs a signal of the second level to the output terminal. If the clock CLK inputted to the third control stage T3 has the second level, then since the transistor N4 and the transistor P4 are in a non-conducting state, the output of the third control stage T3 to the output terminal is kept in a preceding state by the parasitic capacitor of the circuit.

The dynamic flip-flop circuit 400 having such a configuration as described above latches a data signal inputted thereto at a rising edge of the clock CLK and outputs an inverted signal of the latched value as an output signal thereof. In FIG. 13, the output signal is denoted by Q which signifies a non-inverted signal with an overline (inversion mark) added thereto. However, in the present specification, the output signal is represented as inversion signal /Q.

Now, problems of the dynamic flip-flop circuit 400 are described.

FIG. 14 illustrates waveforms at several portions of the dynamic flip-flop circuit 400. Referring to FIG. 14, a node S1 indicates an output of the first control stage T1 to the second control stage T2, and another node S2 indicates an output of the second control stage T2 to the third control stage T3.

While it is expected that the signal waveforms at the several portions coincide with signal waveforms estimated from the theory described hereinabove, actually they are different because of appearance of delay time upon transition of a signal between different levels. One of reasons that delay time appears is that, in order for the signal level at an arbitrary position in the circuit to change, it is necessary to charge or discharge electric charge into or from a parasitic capacitor (capacitance of the parasitic capacitor) of the circuit.

Here, in the P type transistors, the carrier is holes, and since the holes have an effective mass greater than that of the electrons and have a lower mobility than the electrons, the working speed of the P type transistors is lower. Further, an influence of the delay time in the first control stage T1 and the second control stage T2 propagates to the third control stage T3. Furthermore, it is necessary for the transistor P4 of the third control stage T3 to charge electric charge into the capacitance of an external apparatus connected to the output terminal. Accordingly, delay time appears notably particularly with the inversion signal /Q which rises when the transistor P4 of the third control stage T3 is rendered conducting. The delay time when the inversion signal /Q rises is indicated by x and the delay time when the inversion signal /Q falls is indicated by y. It can be confirmed from FIG. 14 that the delay time x is longer than the delay time y.

Such delay time at a rising edge of the inversion signal /Q of the dynamic flip-flop circuit 400 as described above is likely to lead to such a bad influence that desired action may not be obtained when the dynamic flip-flop circuit 400 is used. Although details are hereinafter described, for example, where the dynamic flip-flop circuit 400 is used in a frequency divider, an output of a stable duty ratio of 50% may not be obtained. On the other hand, where the dynamic flip-flop circuit 400 is used in a Johnson counter, a large glitch appears, resulting in a problem that a desired output waveform may not be obtained.

According to an embodiment of the present invention, there is provided a dynamic flip-flop circuit by which a good output waveform can be obtained where it is used in such a frequency divider or a Johnson counter as mentioned above. In the following the dynamic flip-flop circuit 100 according to the present embodiment is described with reference to FIGS. 1 to 4.

Figure 1:
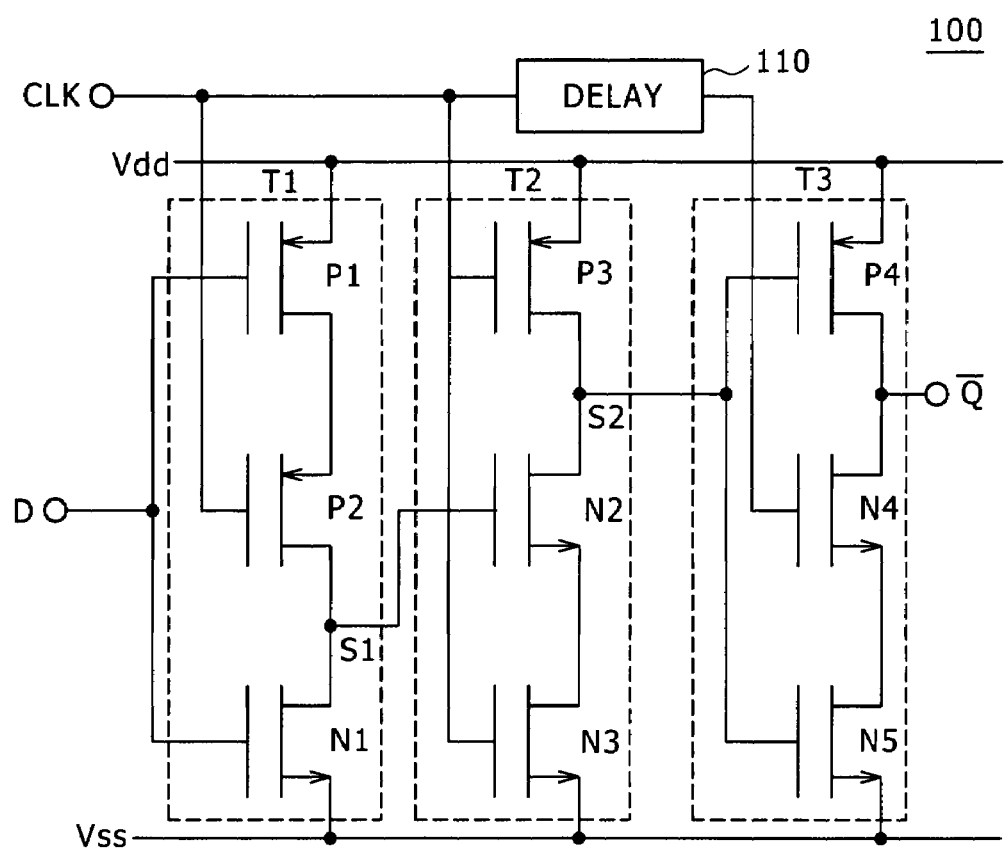
FIG. 1 is a circuit diagram showing a configuration of a dynamic flip-flop circuit according to a preferred embodiment of the present invention.

FIG. 1 shows a configuration of the dynamic flip-flop circuit 100 according to the present embodiment. Referring to FIG. 1, the dynamic flip-flop circuit 100 according to the present embodiment includes a first control stage T1, a second control stage T2, a third control stage T3 and a phase adjustment circuit 110 and operates with a clock CLK, a digital data signal D, a first power supply Vdd and a second power supply Vss supplied thereto.

The configuration and action of the first control stage T1 and the second control stage T2 are substantially same as those of the first control stage T1 and the second control stage T2 of the dynamic flip-flop circuit 400 described hereinabove, and therefore, description of them is omitted herein to avoid redundancy.

The third control stage T3 includes a transistor P4, a transistor N4 and a transistor N5. The transistor P4 is connected at the drain thereof to the first power supply Vdd, at the gate thereof to the source of the transistor P3, and at the source thereof to the output terminal. The transistor N4 is connected at the source thereof to the source of the transistor P4, at the gate thereof to the phase adjustment circuit 110, and at the drain thereof to the source of the transistor N5. The transistor N5 is connected at the source thereof to the drain of the transistor N4, at the gate thereof to the source of the transistor P3, and at the drain thereof to the second power supply Vss.

The phase adjustment circuit 110 is connected between the clock input terminal and the gate of the transistor N4 and adjusts the phase of the clock CLK. The phase adjustment circuit 110 can be formed using a resistance element and/or one, two or more inverters, and an example of the phase adjustment circuit 110 is described below.

Figure 2:
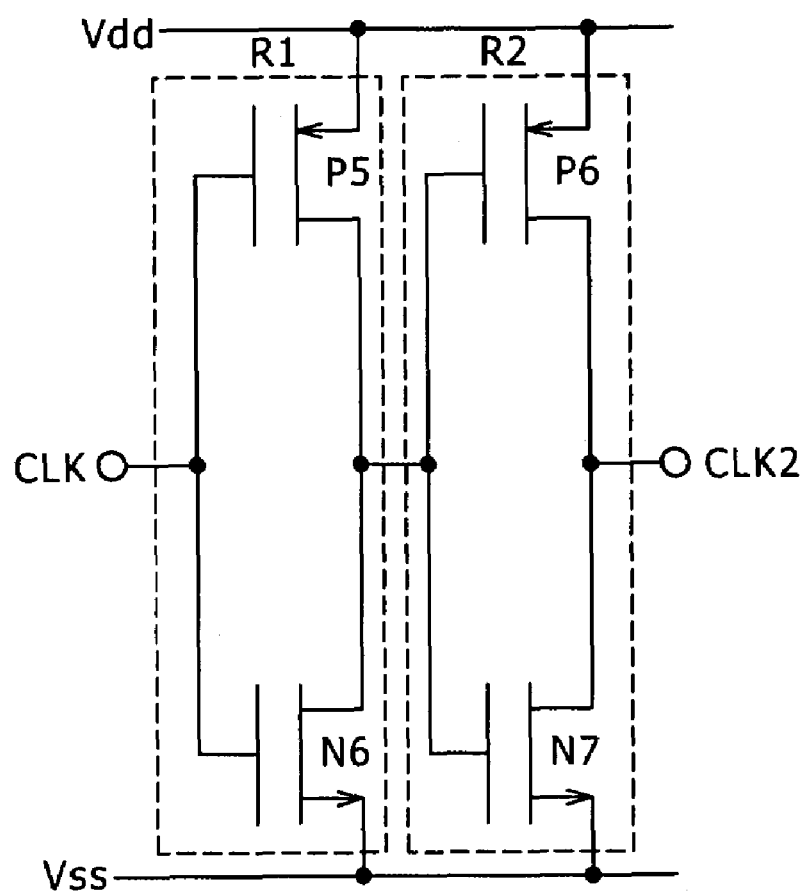
FIG. 2 is a circuit diagram showing an example of the configuration of a phase adjustment circuit of the dynamic flip-flop circuit.

FIG. 2 shows an example of a configuration of the phase adjustment circuit 110. Referring to FIG. 2, the phase adjustment circuit 110 shown includes two inverters R1 and R2. The inverter R1 includes a transistor P5 and another transistor N6. The inverter R2 includes a transistor P6 and another transistor N7.

The transistor P5 is connected at the drain thereof to the first power supply Vdd of the first level, at the gate thereof to the clock input terminal, and at the source thereof to the inverter R2. The transistor N6 is connected at the source thereof to the source of the transistor P5, at the gate thereof to the clock input terminal, and at the drain thereof to the second power supply Vss of the second level.

The transistor P6 is connected at the drain thereof to the first power supply Vdd, at the gate thereof to the source of the transistor P5, and at the source thereof to the gate of the transistor N4. The transistor N7 is connected at the source thereof to the source of the transistor P6, at the gate thereof to the source of the transistor P5, and at the drain thereof to the second power supply Vss. It is to be noted that the phase adjustment circuit 110 may be supplied with different powers including the first power supply Vdd and the second power supply Vss.

Now, action of the phase adjustment circuit 110 and the dynamic flip-flop circuit 100 is described. When the clock CLK is inputted to the phase adjustment circuit 110, the inverter R1 inverts the signal of the clock CLK and outputs the inversion signal. Then, the inverter R2 further inverts the inversion signal inputted from the inverter R1 to produce a second clock CLK2 and outputs the second clock CLK2. Accordingly, the second clock CLK2 has a level substantially equal to that of the inputted clock CLK. However, since the clock CLK is outputted as the second clock CLK2 through the inverters R1 and R2, the second clock CLK2 has a phase displaced from that of the clock CLK. The phase adjustment circuit 110 having the configuration described can delay a rising edge and a falling edge of the clock CLK by approximately several tens picoseconds to several nanoseconds.

Within a period within which the signal inputted from the second control stage T2 has the second level, since the transistor P4 conducts, the third control stage T3 outputs a signal of the first level to the output terminal. Within another period within which the signal inputted from the second control stage T2 has the first level, the transistor P4 does not conduct and the transistor N5 conducts. Further, if the second clock CLK2 has the first level, then since the transistor N4 conducts, the third control stage T3 outputs a signal of the second level to the output terminal. Accordingly, by adjusting the difference between the phase of the clock CLK and the phase of the second clock CLK2, the point of time of a falling edge of the output to the output terminal can be adjusted.

Figure 3:
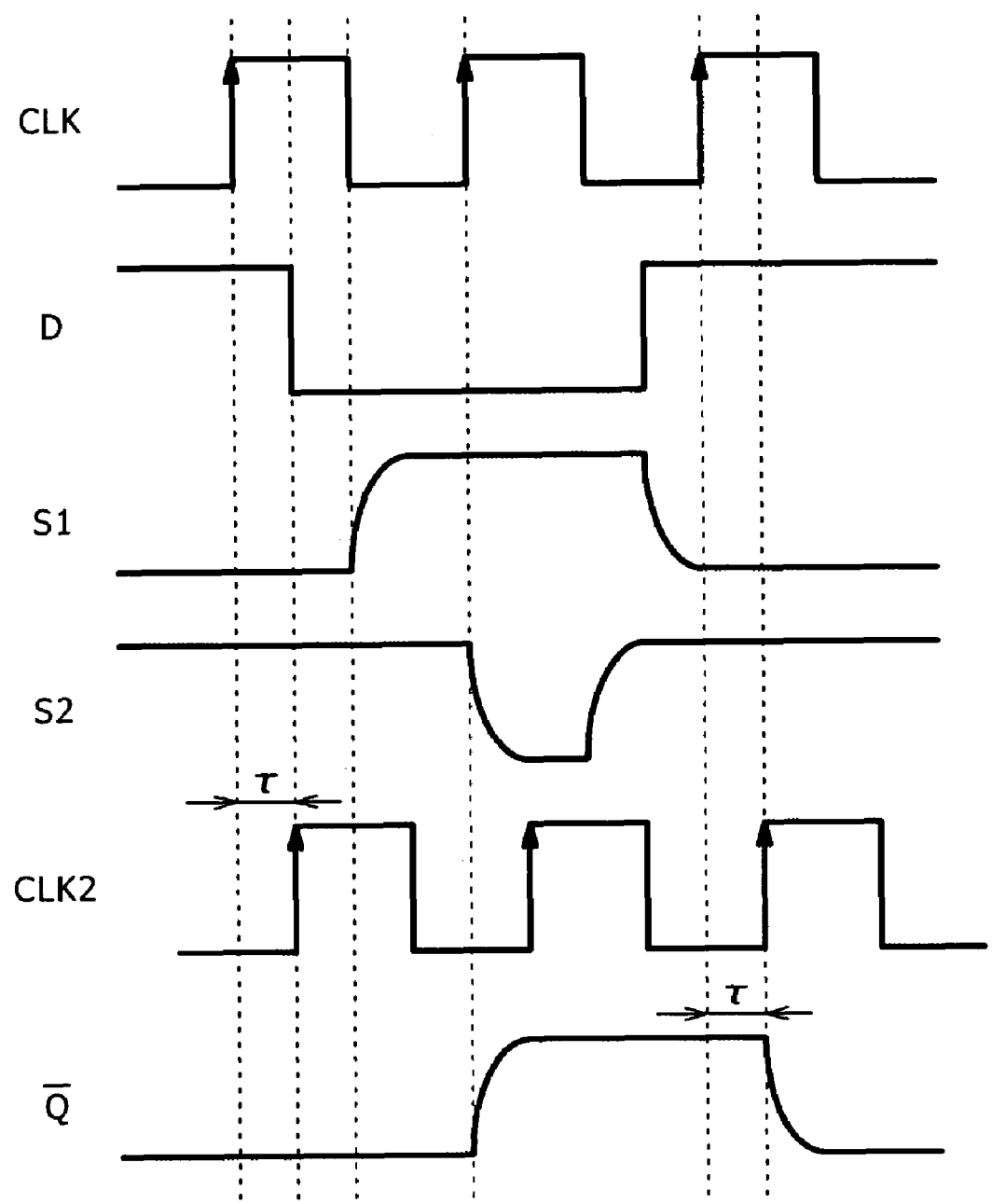
FIG. 3 is a timing chart illustrating waveforms of the dynamic flip-flop circuit.

FIG. 3 illustrates waveforms at several portions of the dynamic flip-flop circuit 100 according to the present embodiment. In the following, effects provided by the phase adjustment circuit 110 are described. It is to be noted that the waveform characteristics at the nodes S1 and S2 are substantially same as those at the nodes S1 and S2 of the dynamic flip-flop circuit 400, and therefore, overlapping description of the waveform characteristics is omitted herein to avoid redundancy.

The second clock CLK2 has a phase adjusted (delayed) by a period of time indicated by a phase difference τ with respect to the phase of the clock CLK by the dynamic flip-flop circuit 100. The inversion signal /Q changes its level from the first level to the second level in response to a rising edge of the second clock CLK2, and therefore, the phase thereof is delayed by a period time corresponding to the phase difference τ.

In other words, by adjusting the timing at which the inversion signal /Q falls in response to delay time when the inversion signal /Q falls using the phase adjustment circuit 110, an output waveform having a desired duty ratio can be obtained.

It is to be noted that the configuration of the phase adjustment circuit 110 is not limited to that described hereinabove with reference to FIG. 2, and the phase adjustment amount can be increased, for example, by increasing the number of inverters. Various phase adjustment can be implemented also by adjusting the channel width or the channel length of the transistors which are components of the phase adjustment circuit 110 to adjust the current driving power. Further, a great number of inverters may be connected in series such that one of the inverters from which an output is to be extracted is selected by switching so that the phase adjustment amount can be adjusted simply and readily.

Figure 4:
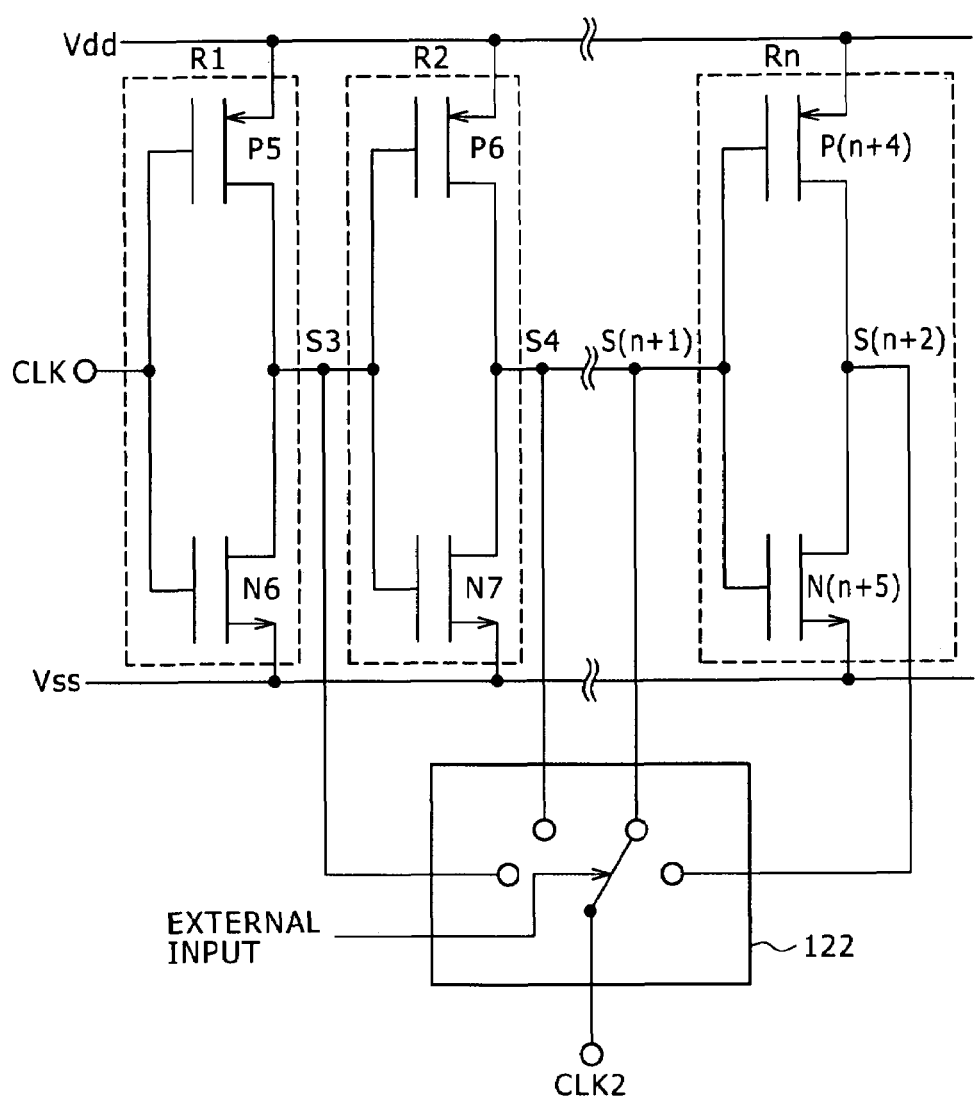
FIG. 4 is a circuit diagram showing another example of the configuration of the phase adjustment circuit.

FIG. 4 shows another form of the phase adjustment circuit. Referring to FIG. 4, the phase adjustment circuit 120 shown includes n stages of inverter circuits R1 to Rn, and a switching section 122. Each of the inverter circuits R1 to Rn includes a P-type transistor and an N-type transistor and has a configuration substantially same as that of the inverter circuits which compose the phase adjustment circuit 110 described hereinabove. Therefore, description of each of the inverter circuits R1 to Rn is omitted herein to avoid redundancy. It is to be noted that n is a positive integer greater than 1.

The switching section 122 is connected between nodes S3 to S(n+2) of the inverter circuits R1 to Rn and the gate of the transistor N4 of the dynamic flip-flop circuit 100. The phase adjustment circuit 120 electrically connects one of the nodes S3 to S(n+2) to the gate of the transistor N4. The node connected to the gate of the transistor N4 may be selected, for example, based on a control signal supplied to the switching section 122 from the outside by the switching section 122. At this time, the signal extracted from the node connected to the gate of the transistor N4 by the switching section 122 functions as the second clock CLK2.

With the phase adjustment circuit 120 having the configuration described above, the phase difference between the clock CLK and the second clock CLK2 can be suitably changed simply and readily in accordance with a hardware resource which uses the dynamic flip-flop circuit 100 or a purpose of a user.

Now, a configuration and output waveforms of a frequency dividing circuit 200 formed using the dynamic flip-flop circuit 100 according to the present embodiment is described with reference to FIGS. 5 to 7.

Figure 5:
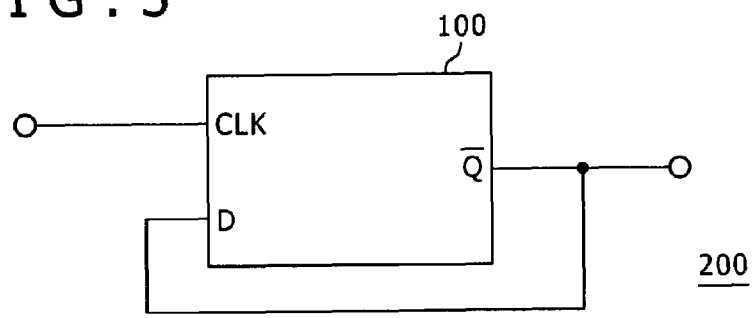
FIG. 5 is a circuit diagram showing a frequency divider formed using the dynamic flip-flop circuit.

FIG. 5 shows the frequency dividing circuit 200 formed using the dynamic flip-flop circuit 100 according to the present embodiment.

Referring to FIG. 5, the frequency dividing circuit 200 is an apparatus which produces a clock of a desired frequency from an output of an oscillation circuit. The dynamic flip-flop circuit 100 which forms the frequency dividing circuit 200 receives supply of a clock from a clock input terminal and outputs an inversion signal /Q to an output terminal. Further, the dynamic flip-flop circuit 100 feeds back the inversion signal /Q to a digital data input terminal thereof.

Figure 6:
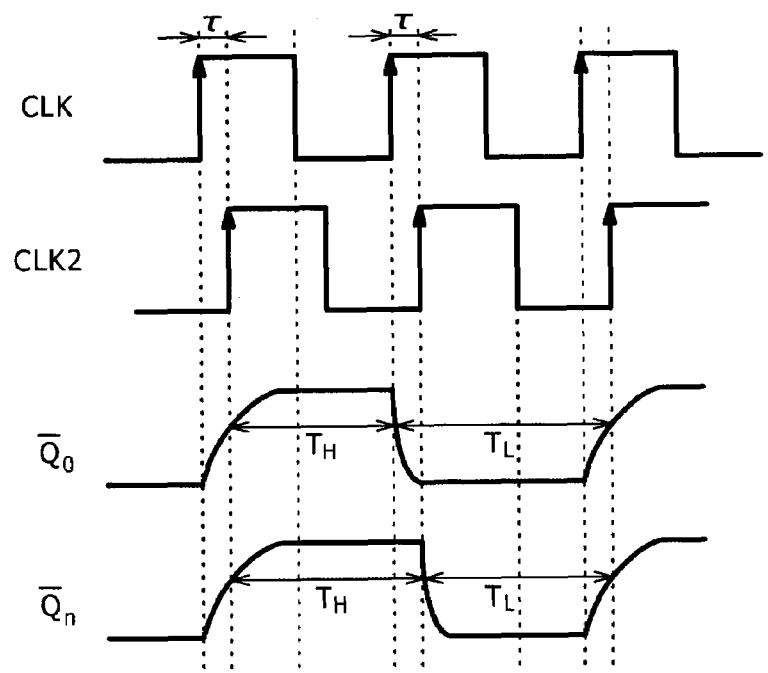
FIG. 6 is a timing chart illustrating output waveforms of the frequency divider.

FIG. 6 illustrates output waveforms of the frequency dividing circuit 200 described above. The second clock CLK2 has a phase adjusted by the phase difference τ with respect to the phase of the clock CLK by the phase adjustment circuit 110.

The waveform /Qo illustrated in FIG. 6 is that of the output signal and also of the feedback signal to the data input terminal where a frequency divider is formed using the dynamic flip-flop circuit 400 described hereinabove as a reference with reference to FIG. 13. The divided clock outputted from the frequency divider is deformed by a delay at a rising edge such that the period $T_H$ within which the first level is exhibited is shorter than the period $T_L$ within which the second level is exhibited and hence the duty ratio is lower than 50%.

The waveform /Qn illustrated in FIG. 6 is that of the output signal of the frequency dividing circuit 200 to which the dynamic flip-flop circuit 100 according to the present embodiment is applied and also of the digital input terminal.

The divided clock /Qn outputted from the frequency dividing circuit 200 exhibits delay at a rising edge thereof similarly to the waveform /Qo. However, the point of time of a falling edge of the waveform /Qn is delayed to the point of time of a rising edge of the second clock CLK2, that is, exhibits delay by the phase difference τ. Accordingly, in the waveform /Qn, the period $T_H$ within which the first level is exhibited and the period $T_L$ within which the second level is exhibited are adjusted, and a higher duty ratio than that of the waveform /Qo, for example, a duty ratio of 50%, can be obtained.

By variably setting the amount of the phase difference τ to be adjusted by the phase adjustment circuit 110, the period $T_H$ within which the first level is exhibited and the period $T_L$ within which the second level is exhibited can be increased or decreased suitably.

Figure 7:
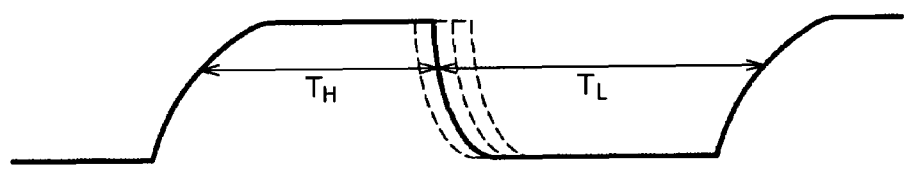
FIG. 7 is a waveform diagram illustrating a manner in which the duty ratio of the frequency divider is varied.

FIG. 7 illustrates a manner wherein the duty ratio of a frequency divider formed using the dynamic flip-flop circuit 100 according to the present embodiment is varied. A solid line curve in FIG. 7 illustrates an output waveform of a frequency divider formed using an existing dynamic flip-flop circuit. By applying the dynamic flip-flop circuit 100 according to the present embodiment to vary the phase adjustment amount of the output waveform of the frequency divider mentioned above by the phase adjustment circuit 110, the period $T_H$ within which the inversion signal /Q exhibits the first level can be increased or decreased arbitrarily, for example, as indicated by a plurality of broken lines in FIG. 7.

More particularly, the period $T_H$ within which the inversion signal /Q exhibits the first level can be increased by retarding the phase of the second clock CLK2 by a small amount from that of the clock CLK as described hereinabove, for example, by approximately 3 to 8% the period of the clock CLK. On the other hand, the period $T_H$ within which the inversion signal /Q exhibits the first level can be decreased by advancing the phase of the second clock CLK2 by a small amount from that of the second clock CLK2, for example, by approximately 3 to 8% the period of the clock CLK. It is to be noted that an effect equivalent to that obtained by advancing the period of the clock CLK by approximately 3 to 8% may be obtained by retarding the period of the clock CLK by 92 to 97% may be obtained.

Now, a configuration and output waveforms of a Johnson counter 300 formed using the dynamic flip-flop circuit 100 according to the present embodiment are described with reference to FIGS. 8 to 11.

Figure 8:
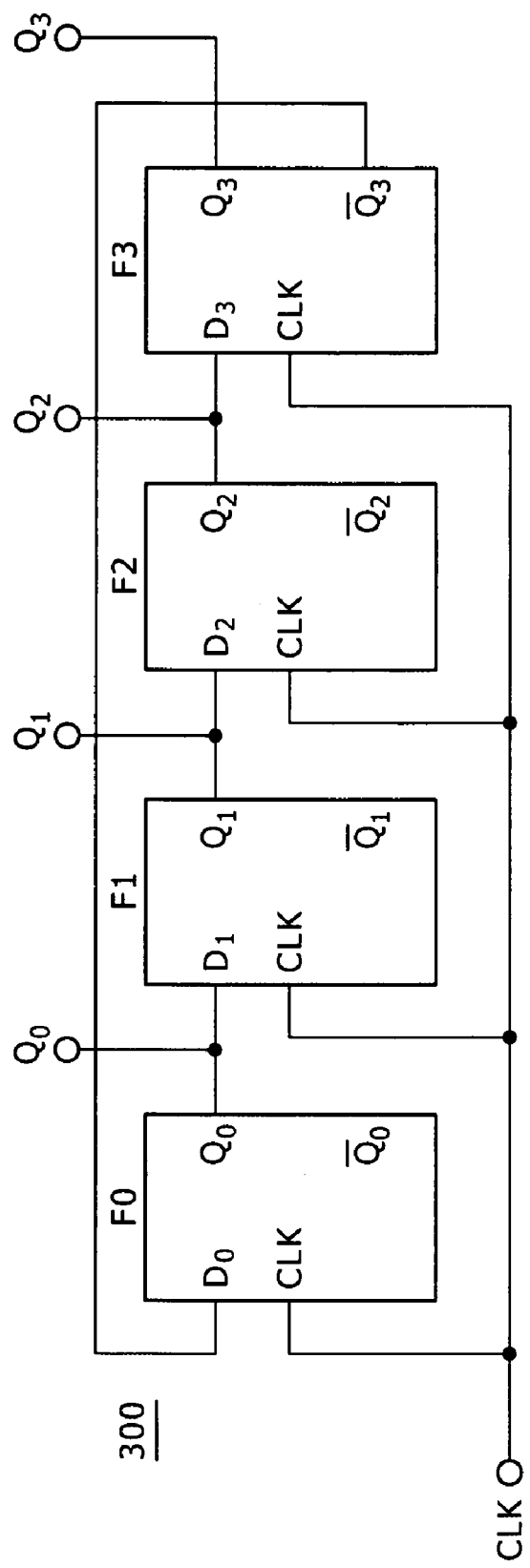
FIG. 8 is a block diagram showing a configuration of a Johnson counter formed using the dynamic flip-flop circuit.

FIG. 8 shows a configuration of the Johnson counter 300 formed using the dynamic flip-flop circuit 100 according to the present embodiment. The Johnson counter 300 is an example of an octave Johnson counter and includes dynamic flip-flop circuits F0 to F3 (hereinafter referred to simply as flip-flop circuits F0 to F3) which receive an input of a clock CLK.

First, action of the Johnson counter 300 is described briefly. The flip-flop circuits F0 to F2 output non-inversion signals $Q_0$ to $Q_2$ of a digital data signal inputted thereto to the flip-flop circuits F1 to F3 of the next stage, respectively. The flip-flop F3 outputs an inversion signal $/Q_3$ of the digital data signal inputted thereto to the flip-flop F0.

Figure 9:
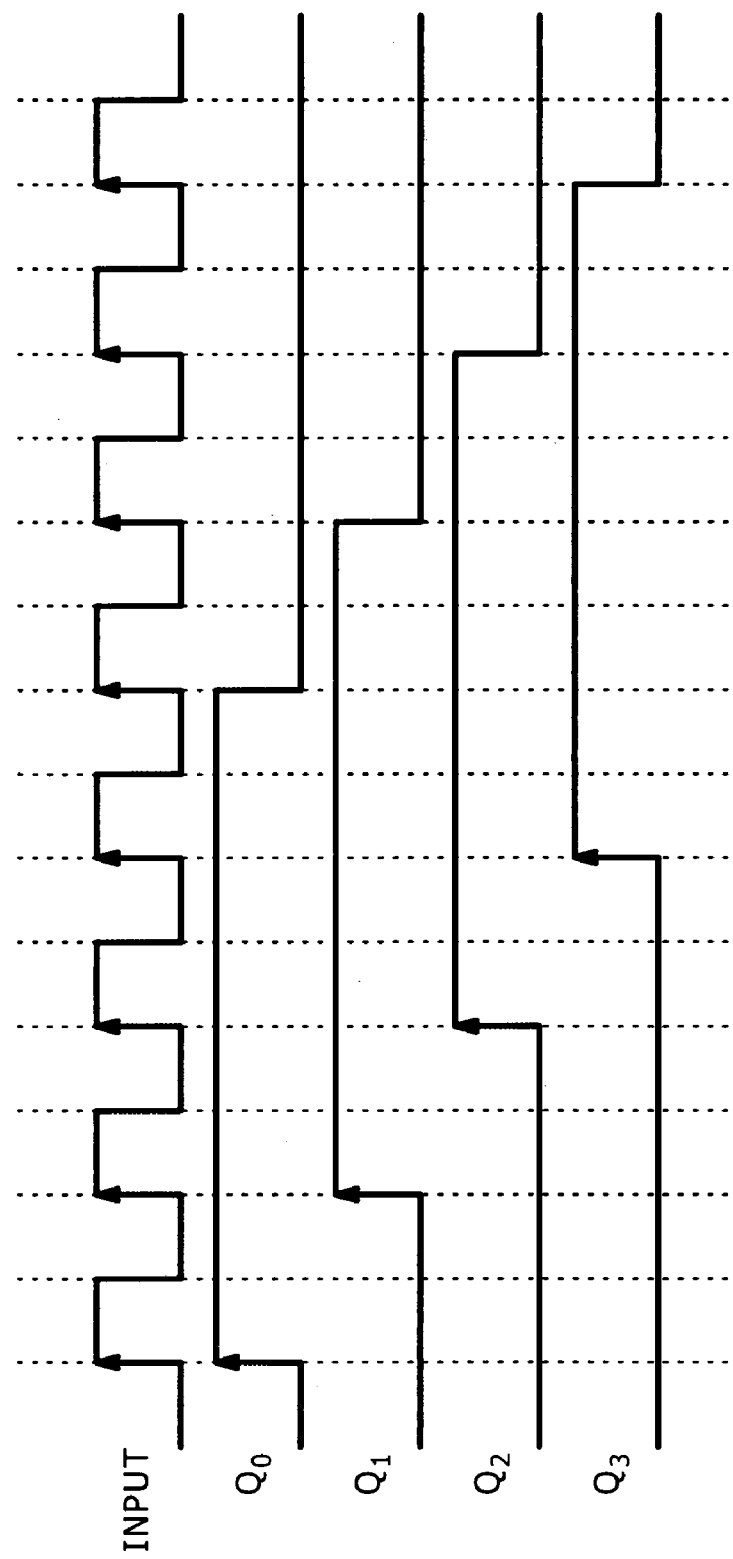
FIG. 9 is a timing chart illustrating output waveforms obtained from flip-flops which compose the Johnson counter.

FIG. 9 illustrates output waveforms obtained from the flip-flop circuits F0 to F3 of the components of the Johnson counter 300 described above. With the Johnson counter 300 having the configuration described, it is expected that non-inversion signals $Q_0$ to $Q_3$ having different phases from one another and having a period equal to four times that of the clock CLK are obtained from the flip-flop circuits F0 to F3 as seen in FIG. 9, respectively.

However, where an existing dynamic flip-flop circuit is used to form a Johnson counter, a large glitch appears with the non-inversion signals $Q_0$ to $Q_3$. Accordingly, also where the inversion signals $Q_0$ to $Q_3$ are extracted from the Johnson counter, a large glitch appears with the inversion signals $Q_0$ to $Q_3$ similarly.

Figure 10:
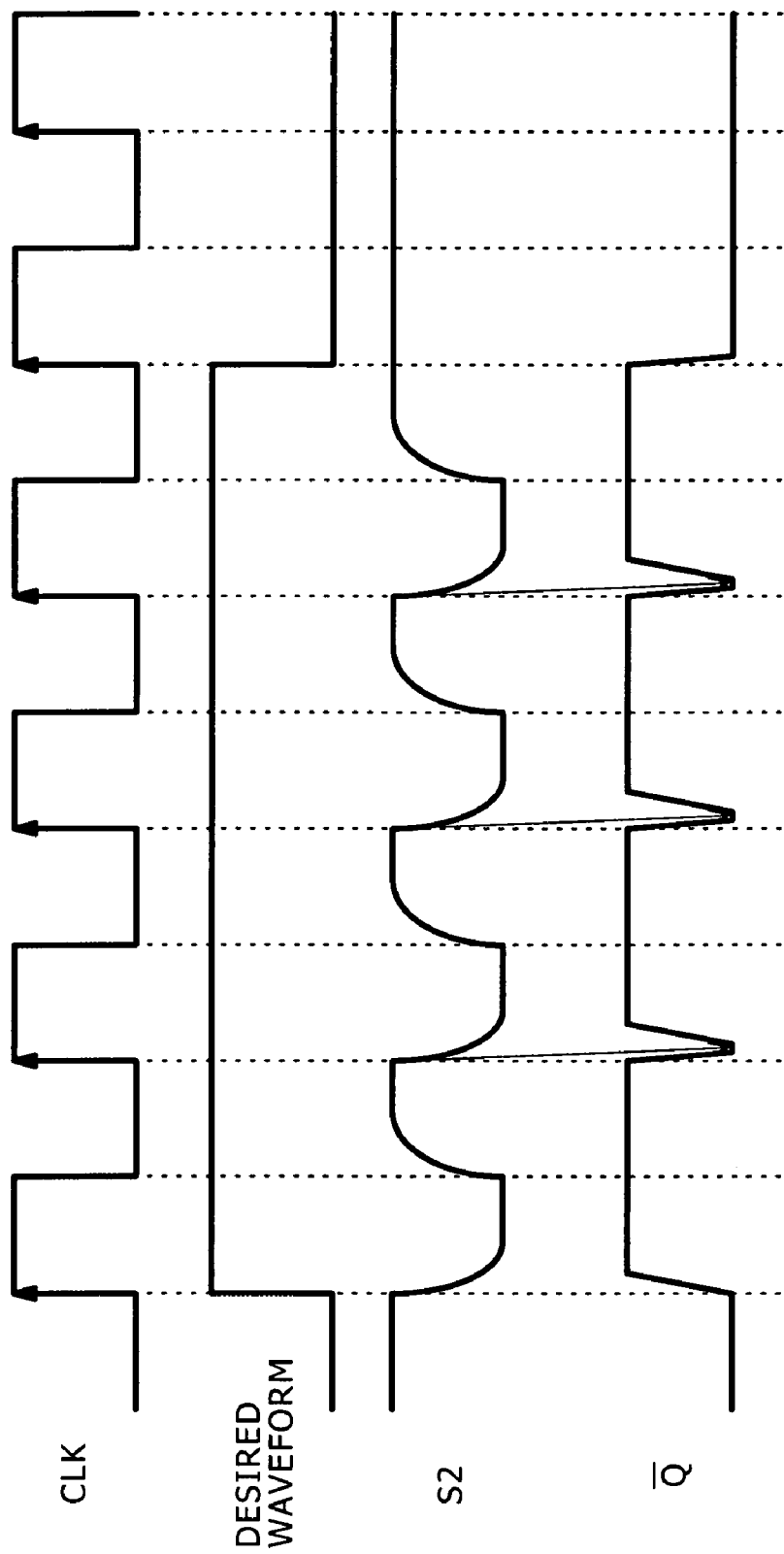
FIG. 10 is a timing chart illustrating output waveforms of another Johnson counter which is formed from dynamic flip-flop circuits.

FIG. 10 illustrates output waveforms of a Johnson counter formed using the dynamic flip-flop circuit 400 described hereinabove as a reference with reference to FIG. 13. It is to be noted that an inversion signal /Q extracted from an arbitrary one of the flip-flop circuits F0 to F3 is illustrated in the waveforms of FIG. 10.

Even if it is tried to extract an output having such a desired waveform as seen in FIG. 10 from the Johnson counter, the actual waveform suffers from variation (glitch) of a level at a rising edge of the clock CLK. The reason why such a glitch as just mentioned appears is described briefly below.

For example, it is assumed that the non-inversion signal $Q_0$ inputted from the flip-flop F0 to the flip-flop F1 has the second level. In this instance, the node S2 of the dynamic flip-flop circuit 400 which composes the flip-flop F1 tends to keep the first level within a period within which the clock CLK inputted to the second control stage T2 has the second level. However, when the level of the clock CLK (having a phase same as that of the clock CLK inputted to the second control stage T2) inputted to the third control stage T3 changes to the first level, the node S2 tends to follow up the level of the digital data signal so that it has the second level.

However, actually since the level of the node S2 may not change to the second level immediately, both of the clock CLK and the node S2 exhibit the first level transiently. Accordingly, when both of the clock CLK and the node S2 come to have the first level, such a glitch as seen in FIG. 10 appears because the level of the inversion signal /Q tends to change from the first level to the second level.

In contrast, with the Johnson counter 300 configured using the dynamic flip-flop circuit 100 according to the present embodiment, a waveform from which such a glitch as described above is decreased by a great amount can be obtained.

Figure 11:
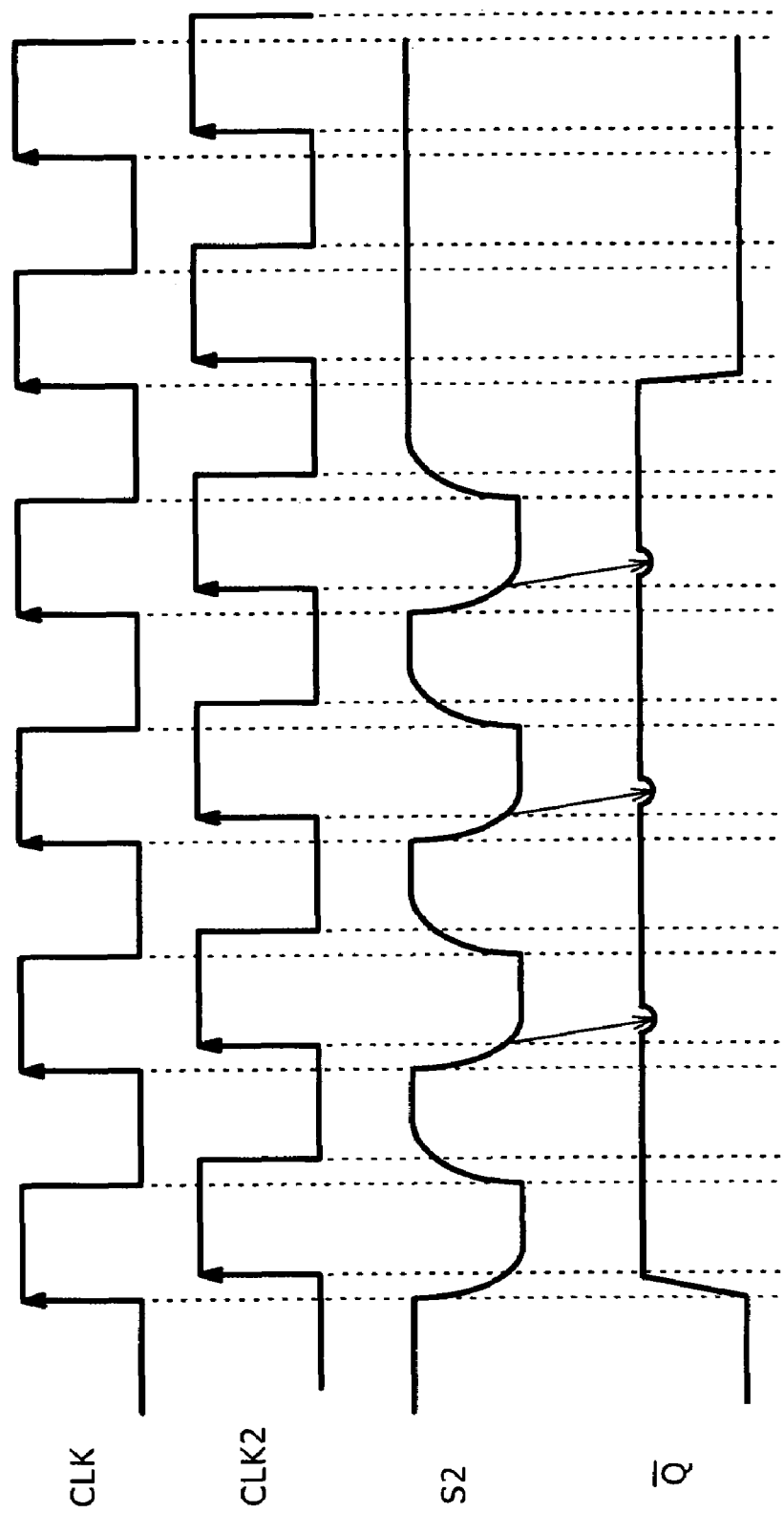
FIG. 11 is a timing chart illustrating output waveforms of a Johnson counter formed using the dynamic flip-flop circuit of FIG. 1.

FIG. 11 illustrates output waveforms of the Johnson counter 300 configured using the dynamic flip-flop circuit 100 according to the present embodiment.

Referring to FIG. 11, it is assumed that the non-inversion signal $Q_0$ inputted from the flip-flop F0 to the flip-flop F1 has the second level similarly as in the example described above. Consequently, the node S2 of the dynamic flip-flop circuit 100 which composes the flip-flop F1 tends to keep the first level within a period within which the clock CLK inputted to the second control stage T2 has the second level. On the other hand, when the level of the second clock CLK2 (having a phase different from that of the clock CLK inputted to the second control stage T2) inputted to the third control stage T3 changes to the first level, then the node S2 tends to follow up the level of the digital data signal to change the level thereof to the second level.

Here, if the phase of the second clock CLK2 is suitably adjusted by the phase adjustment circuit 110 of the dynamic flip-flop circuit 100 according to the present embodiment, then the situation that both of the clock CLK and the node S2 have the first level can be prevented. Accordingly, the glitch which appears with the inversion signal /Q of the Johnson counter 300 at a rising edge of the clock CLK can be reduced significantly.

Figure 12A:
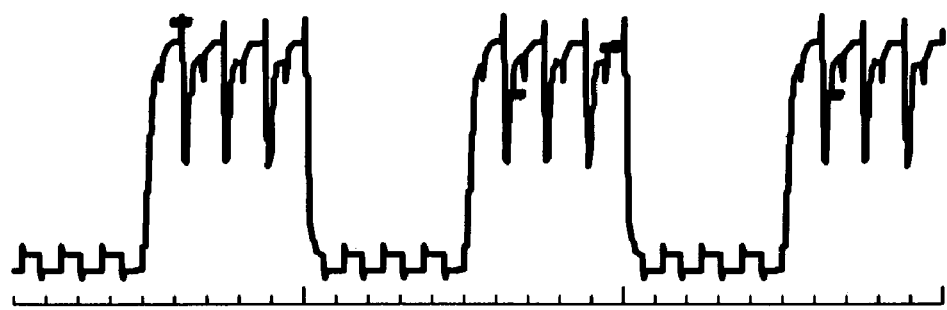
FIGS. 12A and 12B are waveform diagrams illustrating simulation waveforms of outputs of the Johnson counters.
Figure 12B:
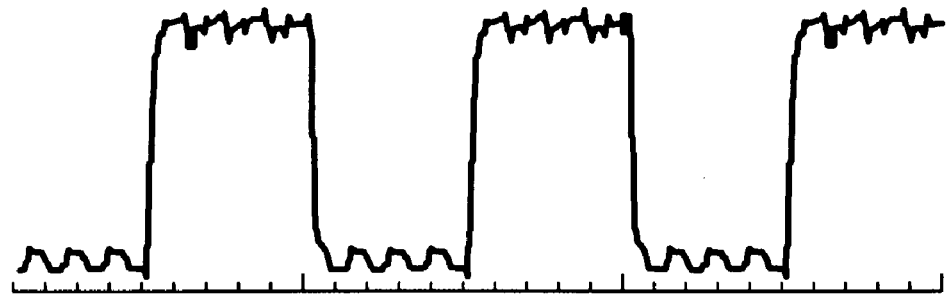

FIGS. 12A and 12B illustrate waveforms of the outputs of the Johnson counters obtained by a simulation. In particular, FIG. 12A illustrates a simulation waveform of the inversion signal /Q extracted from the Johnson counter 300 configured using the dynamic flip-flop circuit 100 according to the present embodiment. FIG. 12B illustrates a simulation waveform of the inversion signal /Q extracted from a Johnson counter configured using the dynamic flip-flop circuit 400 described hereinabove as a reference with reference to FIG. 13.

Where the waveforms of FIGS. 12A and 12B are compared with each other, it can be recognized that the simulation waveform of the inversion signal /Q extracted from the Johnson counter 300 configured using the dynamic flip-flop circuit 100 according to the present embodiment exhibits glitches reduced significantly when compared with the simulation waveform of the inversion signal /Q extracted from the Johnson counter configured using: the dynamic flip-flop circuit 400 described as a reference with reference to FIG. 13.

While a preferred embodiment of the present invention has been described above with reference to the accompanying drawings, naturally the present invention is not limited to the embodiment. It is apparent that a person skilled in the art could have made various alterations or modifications without departing from the spirit and scope of the invention as defined in claims, and it is understood that also such alterations and modifications naturally fall within the technical scope of the present invention.

For example, the configuration of the dynamic flip-flop circuit in which the phase adjusted circuit 110 is provided is not limited to that of the dynamic flip-flop circuit 100 described hereinabove with reference to FIG. 1, but the dynamic flip-flop circuit can be configured in various manners. One of such configurations is shown in FIG. 15.

Figure 15:
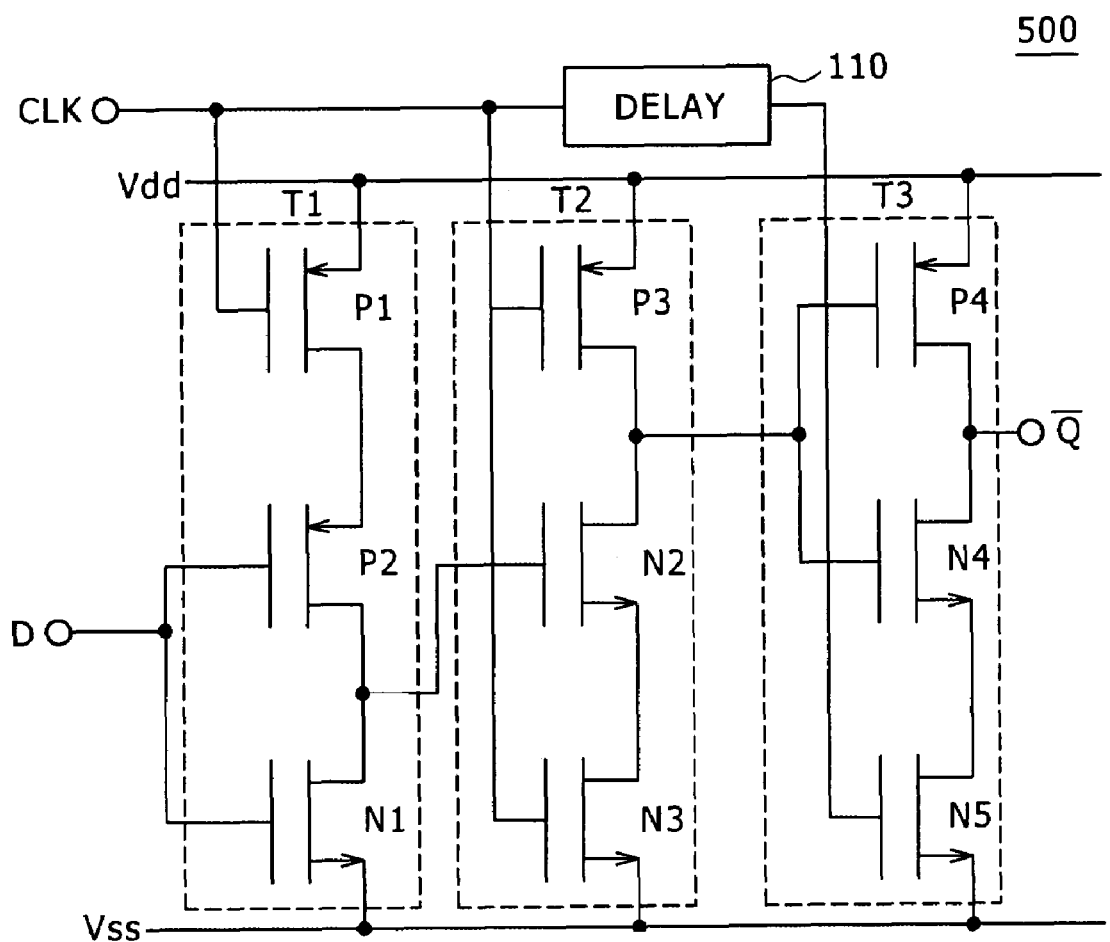
FIG. 15 is a circuit diagram showing a configuration of another dynamic flip-flop circuit to which the present invention is applied.

FIG. 15 shows a configuration of a dynamic flip-flop circuit 500 according to another embodiment of the present invention. Referring to FIG. 15, the dynamic flip-flop circuit 500 according to the present embodiment shown includes a first control stage T1, a second control stage T2, a third control stage T3 and a phase adjustment circuit 110 and operates with a clock CLK, a digital data signal D, a first power supply Vdd and a second power supply Vss supplied thereto.

The dynamic flip-flop circuit 500 has a basically similar configuration to that of the dynamic flip-flop circuit 100, and differences of the dynamic flip-flop circuit 500 from the dynamic flip-flop circuit 100 are described below.

A clock CLK is inputted to the gate of the transistor P1 of the first control stage T1. A digital data signal is inputted to the gate of the transistor P2. The second control stage T2 has a configuration substantially same as that of the dynamic flip-flop circuit 100. The transistor N4 of the third control stage T3 is connected at the gate thereof to the source of the transistor P3. A second clock CLK2 is inputted to the gate of the transistor N5.

While the dynamic flip-flop circuit 500 has some differences in configuration from the dynamic flip-flop circuit 100 as described above, it can operate similarly to the dynamic flip-flop circuit 100. In particular, with the dynamic flip-flop circuit 500, for example, where a frequency divider is formed, a desired duty ratio can be obtained by adjusting the timing at which a signal outputted from the dynamic flip-flop circuit 500 is to fall based on the second clock CLK2 produced by the phase adjustment circuit 110.

What is claimed is:

1. A dynamic flip-flop circuit which outputs an output signal on which a digital data signal is reflected based on a clock, comprising:
    a first control stage configured to output, within a period within which the clock has a second level, a signal having a level inverted from that of the digital data signal;
    a second control stage configured to output, within the period within which the clock has the second level, a signal of a first level, and to output, within another period within which the clock has the first level, a signal of a level based on the signal outputted from said first control stage;
    a third control stage configured to output, within a period within which the signal outputted from said second control stage has the second level, an output signal of the first level which makes the output signal of said dynamic flip-flop circuit; and
    a phase adjustment circuit configured to adjust the phase of the clock to produce a second clock and supply the second clock to said third control stage.

2. The dynamic flip-flop circuit according to claim 1, wherein said phase adjustment circuit includes one inverter circuit or two or more inverter circuits connected in series.

3. The dynamic flip-flop circuit according to claim 2, wherein said phase adjustment circuit uses an output of one of the two or more inverter circuits connected in series as the second clock.

4. The dynamic flip-flop circuit according to claim 1, wherein said phase adjustment circuit is formed from a resistance element and a parasitic capacitor of the circuit.

5. The dynamic flip-flop circuit according to claim 1, wherein each of said first, second and third control stages includes a field effect transistor.

6. A dynamic flip-flop circuit which outputs an output signal on which a digital data signal is reflected based on a clock, comprising:
    a first P-type transistor connected to receive, at the gate thereof, the digital signal and connected at the drain thereof to a first power supply;
    a second P-type transistor connected to receive, at the gate thereof, the clock and connected at the drain thereof to the source of said first P-type transistor;
    a first N-type transistor connected to receive, at the gate thereof, the digital data signal and connected at the source thereof to the source of said second P-type transistor and at the drain thereof to a second power supply;
    a third P-type transistor connected to receive, at the gate thereof, the clock and connected at the drain thereof to said first power supply;
    a second N-type transistor connected at the gate thereof to the source of said second P-type transistor and connected at the source thereof to the source of said third P-type transistor;

a third N-type transistor connected to receive, at the gate thereof, the clock and connected at the source thereof to the drain of said second N-type transistor and at the drain thereof to the second power supply;

a fourth P-type transistor connected at the gate thereof to the source of said third P-type transistor and at the drain thereof to the first power supply and connected at the source thereof so as to output the output signal;

a fourth N-type transistor connected to receive, at the gate thereof, the clock and connected at the source thereof to the source of said fourth P-type transistor;

a fifth N-type transistor connected at the gate thereof to the source of said third P-type transistor, at the source thereof to the drain of said fourth N-type transistor and at the drain thereof to the second power supply; and a phase adjustment circuit connected to receive the clock and configured to adjust the phase of the clock to produce a second clock to be supplied to the gate of said fourth N-type transistor.

* * * * *